United States Patent
Brunner et al.

(10) Patent No.: US 7,075,323 B2
(45) Date of Patent: Jul. 11, 2006

(54) LARGE SUBSTRATE TEST SYSTEM

(75) Inventors: Matthias Brunner, Kirchheim (DE); Shinichi Kurita, San Jose, CA (US); Wendell T. Blonigan, Pleasanton, CA (US); Edgar Kehrberg, Haar (DE)

(73) Assignee: Applied Materials, Inc., Santa Clara, CA (US)

( * ) Notice: Subject to any disclaimer, the term of this patent is extended or adjusted under 35 U.S.C. 154(b) by 3 days.

(21) Appl. No.: 10/901,936

(22) Filed: Jul. 29, 2004

(65) Prior Publication Data

US 2006/0022694 A1   Feb. 2, 2006

(51) Int. Cl.
    *G01R 31/26*   (2006.01)
(52) U.S. Cl. .................... 324/765; 324/751; 324/158.1
(58) Field of Classification Search .................... None
    See application file for complete search history.

(56) References Cited

U.S. PATENT DOCUMENTS

| | | |
|---|---|---|
| 3,983,401 A | 9/1976 | Livesay |
| 4,090,056 A | 5/1978 | Lockwood et al. |
| 4,437,044 A | 3/1984 | Veith |
| 4,495,966 A | 1/1985 | Longamore |
| 4,528,452 A | 7/1985 | Livesay |
| 4,725,736 A | 2/1988 | Crewe |
| 4,740,705 A | 4/1988 | Crewe |
| 4,760,567 A | 7/1988 | Crewe |
| 4,764,818 A | 8/1988 | Crew |
| 4,819,038 A | 4/1989 | Alt |
| 4,843,312 A | 6/1989 | Hartman et al. |
| 4,862,075 A | 8/1989 | Choi et al. |
| 4,870,357 A | 9/1989 | Young et al. |
| 4,899,105 A | 2/1990 | Akiyama |
| 4,983,833 A | 1/1991 | Brunner et al. |
| 4,985,681 A | 1/1991 | Brunner et al. |
| 5,124,635 A | 6/1992 | Henley |
| 5,170,127 A | 12/1992 | Henley |
| 5,175,495 A | 12/1992 | Brahme et al. |
| 5,177,437 A | 1/1993 | Henley |

(Continued)

FOREIGN PATENT DOCUMENTS

EP    0 204 855 A1    12/1986

(Continued)

OTHER PUBLICATIONS

U.S. Appl. No. 10/778,982, filed Feb. 12, 2004, Shinichi Kurita, et al., "Electron Beam Test System With Integrated Substrate Transfer Module."

(Continued)

*Primary Examiner*—Minh N. Tang
(74) *Attorney, Agent, or Firm*—Patterson & Sheridan LLP

(57) ABSTRACT

A method and system for testing one or more large substrates are provided. In one or more embodiments, the system includes a testing chamber having a substrate table disposed therein. The substrate table is adapted to move a substrate within the testing chamber in various directions. More particularly, the substrate table includes a first stage movable in a first direction, and a second stage movable in a second direction, wherein each of the stages moves in an X-direction, Y-direction or both X and Y directions. The system further includes a load lock chamber at least partially disposed below the testing chamber, and a transfer chamber coupled to the load lock chamber and the testing chamber. In one or more embodiments, the transfer chamber includes a robot disposed therein which is adapted to transfer substrates between the load lock chamber and the testing chamber.

34 Claims, 13 Drawing Sheets

U.S. PATENT DOCUMENTS

| | | | |
|---|---|---|---|
| 5,258,706 A | 11/1993 | Brunner et al. | |
| 5,268,638 A | 12/1993 | Brunner et al. | |
| 5,278,494 A | 1/1994 | Obigane | |
| 5,285,150 A | 2/1994 | Henley et al. | |
| 5,313,156 A | 5/1994 | Klug et al. | |
| 5,368,676 A | 11/1994 | Nagaseki et al. | |
| 5,369,359 A | 11/1994 | Schmitt | |
| 5,371,459 A | 12/1994 | Brunner et al. | |
| 5,414,374 A | 5/1995 | Brunner et al. | |
| 5,504,438 A | 4/1996 | Henley | |
| 5,558,717 A | 9/1996 | Zhao et al. | |
| 5,801,764 A | 9/1998 | Koizumi et al. | |
| 5,834,007 A | 11/1998 | Kubota | |
| 5,834,773 A | 11/1998 | Brunner et al. | |
| 5,914,493 A * | 6/1999 | Morita et al. | 250/492.2 |
| 5,982,190 A | 11/1999 | Toro-Lira | |
| 6,086,362 A | 7/2000 | White et al. | |
| 6,137,303 A | 10/2000 | Deckert et al. | |
| 6,344,115 B1 * | 2/2002 | Azuma et al. | 204/192.34 |
| 6,344,750 B1 * | 2/2002 | Lo et al. | 324/751 |
| 6,435,868 B1 | 8/2002 | White et al. | |
| 6,559,454 B1 | 5/2003 | Murrell et al. | |
| 6,566,897 B1 | 5/2003 | Lo et al. | |
| 6,593,152 B1 * | 7/2003 | Nakasuji et al. | 438/14 |
| 6,765,203 B1 | 7/2004 | Abel | |
| 6,833,717 B1 * | 12/2004 | Kurita et al. | 324/751 |
| 2001/0000662 A1 | 5/2001 | Hashimoto et al. | |
| 2002/0024023 A1 | 2/2002 | Brunner et al. | |
| 2002/0034886 A1 | 3/2002 | Kurita et al. | |
| 2002/0043662 A1 | 4/2002 | Yamazaki et al. | |
| 2003/0218456 A1 | 11/2003 | Brunner et al. | |

FOREIGN PATENT DOCUMENTS

| | | |
|---|---|---|
| EP | 0 370 276 A1 | 1/1991 |
| EP | 0 370 276 B1 | 1/1991 |
| EP | 0 537 505 A1 | 11/1993 |
| EP | 0 537 505 B1 | 11/1993 |
| EP | 0 542 094 A1 | 11/1994 |
| EP | 0 542 094 B1 | 11/1994 |
| EP | 0 932 182 A2 | 7/1999 |
| EP | 0 932 182 A3 | 7/1999 |
| JP | 63 88741 | 4/1988 |
| JP | 63 88742 | 4/1988 |
| JP | 63 166132 | 7/1988 |
| JP | 63 318054 | 12/1988 |
| JP | 1 213944 | 8/1989 |
| JP | 1 307148 | 12/1989 |
| JP | 6 167538 | 6/1994 |
| JP | 7 302563 | 11/1995 |
| JP | 8 173418 | 7/1996 |
| JP | 11264940 | 9/1999 |
| JP | 2000 180392 | 6/2000 |
| JP | 2000 223057 | 8/2000 |
| JP | 2000 268764 | 9/2000 |
| JP | 2001 033408 | 2/2001 |
| JP | 2002 039976 | 2/2002 |
| JP | 2002 048740 | 2/2002 |
| JP | 2002 257997 | 9/2002 |
| JP | 2002 310959 | 10/2002 |
| JP | 2004 014402 | 1/2004 |
| WO | WO 92/09900 | 6/1992 |
| WO | WO 99/60614 | 11/1999 |
| WO | WO 02/33745 | 4/2002 |

OTHER PUBLICATIONS

U.S. Appl. No. 10/889,695, filed Jul. 12, 2004, Matthias Brunner, et al., "Configurable Proper For TFT LCD Array Testing."

U.S. Appl. No. 10/903,216, filed Jul. 30, 2004, Matthias Brunner, et al., "Configurable Proper For TFT LCD Array Test."

Brunner, et al., "Development of Puma 5500/10K Platform," AKTNews, vol. 5, Jan. 2001, p. 13-14.

Brunner, M., "TFT Array Testing: Replacing Mechanics by Electron Beam Deflection," AKTNews, vol. 6, Apr. 2001, p. 15-17.

Copy of Invitation to Pay Additional Fees dated Oct. 21, 2003 for corresponding PCT application, PCT/US03/15903.

PCT International Search Report for PCT/US03/15903, dated Jan. 16, 2004.

PCT International Search Report for PCT/US05/25999, dated Nov. 8, 2005.

* cited by examiner

LARGE SUBSTRATE TEST SYSTEM

BACKGROUND OF THE INVENTION

1. Field of the Invention

Embodiments of the invention generally relate to an electronic test system for large substrates. More particularly, embodiments of the invention generally relate to an electron beam test system for large glass panel substrates.

2. Description of the Related Art

Active matrix liquid crystal displays (LCDs) are commonly used for applications such as computer and television monitors, cell phone displays, personal digital assistants (PDAs), and an increasing number of other devices. Generally, an active matrix LCD includes two substrates, such as two glass panels for example with a layer of liquid crystal materials held therebetween. One of the substrates typically includes a conductive film formed thereon. The other substrate typically includes an array of thin film transistors (TFTs) coupled to an electrical power source. Each TFT may be switched on or off to generate an electrical field between a TFT and the conductive film. The electrical field changes the orientation of the liquid crystal material, creating a pattern on the LCD.

The demand for larger displays, increased production and lower manufacturing costs has created a need for new manufacturing systems that can accommodate larger substrate sizes. Current TFT LCD processing equipment is generally configured to accommodate substrates up to about 1.5×1.8 meters. However, processing equipment configured to accommodate substrates sizes up to and exceeding 1.9× 2.2 meters is envisioned in the immediate future. Therefore, the size of the processing equipment as well as the process throughput time is a great concern to TFT LCD manufacturers, both from a financial standpoint and a design standpoint.

For quality control and profitability reasons, TFT LCD manufacturers are increasingly turning toward device testing to monitor and correct defects during processing. Electron beam testing (EBT) can be used to monitor and troubleshoot defects during the manufacturing process, thereby increasing yield and reducing manufacturing costs. In a typical EBT process, TFT response is monitored to provide defect information. For example, EBT can be used to sense TFT voltages in response to a voltage applied across the TFT. Alternatively, a TFT may be driven by an electron beam and the resulting voltage generated by the TFT may be measured.

During testing, each TFT is positioned under an electron beam. This is accomplished by positioning a substrates on a table positioned below the beam and moving the table to sequentially position each TFT on the substrate below the electron beam test device. As substrates increase in size, so does the table and associated equipment used for the testing. Larger equipment requires more space, i.e., a larger footprint per processing unit throughput, resulting in a higher cost of ownership. The large size of the equipment also increases the costs associated with shipping and may, in some cases, restrict the means and locales to which such equipment may be transported.

There is a need, therefore, for a compact testing system for large substrates that requires less clean room space and that can reliably position large substrates under an EBT device.

SUMMARY OF THE INVENTION

A system for testing one or more large substrates and method for using the same are provided. In one or more embodiments, the system includes a testing chamber having a substrate table disposed therein. The substrate table is adapted to move a substrate within the testing chamber in various directions. More particularly, the substrate table includes a first stage movable in a first direction, and a second stage movable in a second direction. Preferably, the first and second directions are substantially orthogonal. The system further includes a load lock chamber at least partially disposed below the testing chamber, and a transfer chamber coupled to the load lock chamber and the testing chamber. In one or more embodiments, the transfer chamber includes a robot disposed therein that is adapted to transfer substrates between the load lock chamber and the testing chamber.

In one or more embodiments the system includes a load lock chamber disposed adjacent a testing chamber. The testing chamber includes a substrate table disposed therein. The substrate table is adapted to move a substrate within the testing chamber in horizontal and vertical directions. The substrate table includes a first stage movable in a first direction, a second stage movable in a second direction, and a vertically movable lift mechanism. Each of the first and second stages move in an "X direction," "Y direction," or both "X and Y directions." In any of the embodiments described above or elsewhere herein, the system may further include one or more electronic test devices disposed on an upper surface of the testing chamber.

In one or more embodiments, the method includes loading a substrate to be tested into a testing chamber having a substrate table disposed therein. The substrate table is capable of moving the substrate within the testing chamber. The substrate table includes a first stage movable in a first direction, and a second stage movable in a second direction. The first direction and the second direction are substantially orthogonal. In one or more embodiments, the method further includes elevating the substrate table to position the substrate in a testing position, and testing the substrate using one or more electronic test devices disposed on an upper surface of the testing chamber. Each of the first and second stages move in an X direction, Y direction, or both X and Y directions to position a substrate below the one or more electronic test devices. In one or more embodiments, the method may further include lowering the substrate table to an elevation of a load lock chamber disposed adjacent a first side of the testing chamber, extending the end effector into the load lock chamber, loading the substrate in the load lock chamber, and retracting the end effector.

BRIEF DESCRIPTION OF THE DRAWINGS

So that the manner in which the features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

An electron test system and method for using the same are provided. The test system is an integrated system requiring minimum space, and is capable of testing substrates of from 15,000 mm² or more. The term "substrate" as used herein refers to a flat panel display substrate, and includes a glass substrate having one or more thin film transistors disposed thereon.

In one or more embodiments, the test system includes a load lock chamber, a transfer chamber, a testing chamber, and one or more test columns. In one or more embodiments, at least a portion of the load lock chamber is mounted below the testing chamber and adjacent the transfer chamber. In one or more embodiments, the testing chamber is integrated with a transfer chamber and disposed adjacent a load lock chamber. In any one or more of the embodiments identified above or elsewhere herein, the transfer chamber, the load lock chamber, and the testing chamber share a common environment which is typically maintained at a vacuum condition.

The test system described is capable of conducting any of a plurality of test methods known in the art. Illustrative test methods include, but are not limited to, electron beam testing (EBT), full contact probing, voltage imaging, short bar testing, visual inspection, automated optical inspection, and any combination thereof. Preferably, the test system described is used for EBT. For simplicity and ease of description, the test system will be further described below in terms of a test system configured for EBT.

Figure 1:
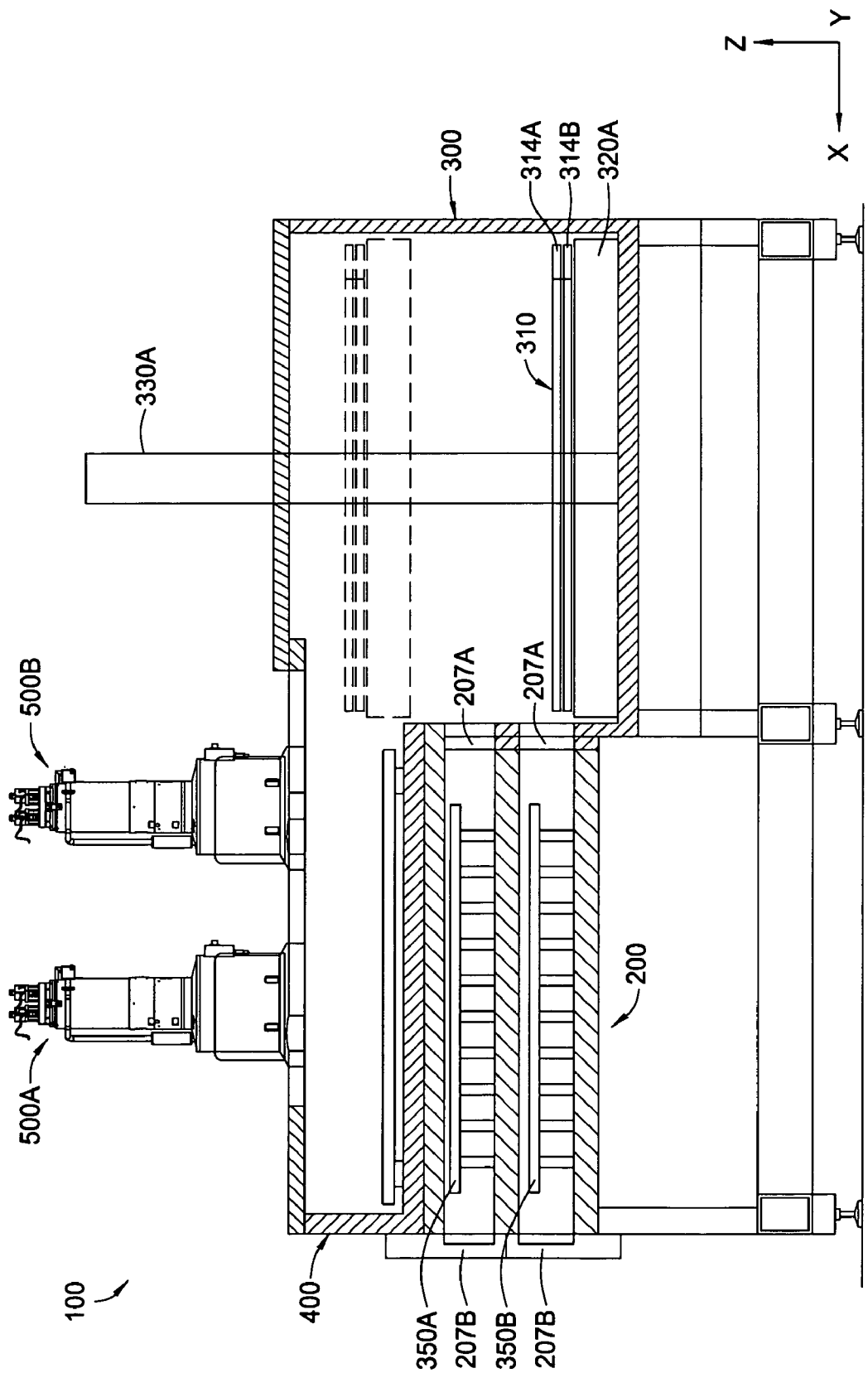
FIG. 1 shows a schematic view of one embodiment of an electronic test system utilizing a load lock chamber, a transfer chamber, and a test station.

Embodiments shown in the drawings will now be described. FIG. 1 shows a partial sectional view of one embodiment of a test system 100. The test system 100 generally includes a load lock chamber 200, a transfer chamber 300, and a testing chamber 400. At least a portion of the load lock chamber 200 is located below the testing chamber 400. In one or more embodiments, the testing chamber 400 is mounted or positioned directly above the load lock chamber 200 as shown in FIG. 1. The stacked or vertical arrangement of the load lock chamber 200 and the testing chamber 400 greatly reduces the foot print or foundation of the overall test system 100. As such, the test system 100 is smaller and consumes less clean room space.

The transfer chamber 300 may be positioned adjacent to the load lock chamber 200 and the testing chamber 400. The height of the transfer chamber 300 is about the size of the combined height of the load lock chamber 200 and the testing chamber 400 in the stacked arrangement.

The load lock chamber 200, transfer chamber 300, and testing chamber 400 are in fluid communication with one another and share a common environment that is maintained at a vacuum condition. As such, one or more substrates can be maneuvered through the test system 100 without exposure to outside conditions or contaminates.

Figure 2:
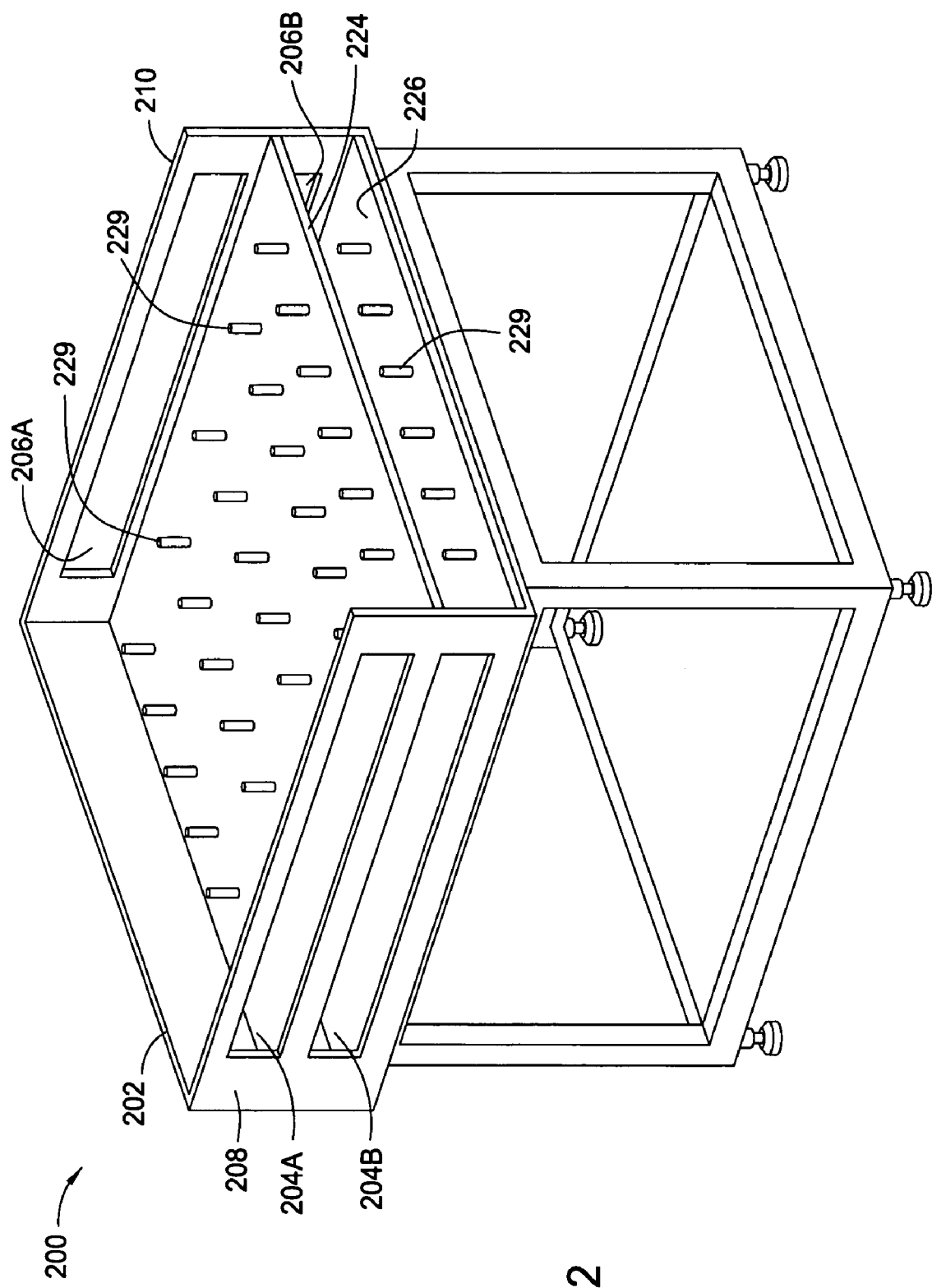
FIG. 2 shows an enlarged schematic view of the load lock chamber of FIG. 1.

Considering the load lock chamber 200 in more detail, FIG. 2 shows an enlarged schematic view of one particular embodiment of a load lock chamber 200. As shown, the load lock chamber 200 may include a chamber body 202 having a dual slot substrate support disposed therein. The dual slot support includes a first substrate support tray 224 and a second substrate support tray 226 that are maintained in a vertically arranged, spaced-apart relationship. In one or more embodiments, the load lock chamber 200 may include a chamber body 202 having a double, dual slot substrate support (not shown). An illustrative double, dual slot substrate support is shown and described in U.S. Patent Application Publication No. 2002/0034886, titled "Double Dual Slot Load Lock for Process Equipment," which is incorporated by reference in that regard.

In one or more embodiments, one or more support pins 229 are coupled to an upper surface of each substrate support tray 224, 226 or at least partially disposed therethrough to support a substrate. For example, the support pins 229 may be affixed to the upper surface of the trays 224, 226 or the pins 229 may insert with in a receiving hole formed in the trays 224 and 226. The support pins 229 may be manufactured from metal, metal alloys, or ceramics, quartz, sapphire, silicon nitride or other suitable non-metallic materials, for example. The support pins 229 may be of any height, and provide a pre-determined spacing or gap between a lower surface of the substrate and the upper surface of the substrate support tray 224 or 226. The gap prevents direct contact between the substrate support tray 224, 226 and the substrate disposed thereon, which might damage the substrates or result in contaminants being transferred from the substrate support trays 224, 226 to the substrates.

In one or more embodiments, a support pin 229 may have a rounded upper portion that contacts the substrate disposed thereon. The rounded surface reduces surface area in contact with the substrate thereby reducing the chances of breaking or chipping the substrate. In one or more embodiments, the rounded surface resembles a hemispherical, ellipsoidal, or parabolic shape. The rounded surface may have either a machined or polished finish or other suitable finish of adequate smoothness. In one or more embodiments, the rounded surface has a surface roughness no greater than 4 micro inches. In one or more embodiments, the rounded upper portion of the support pin 229 is coated with a chemically inert material to reduce or eliminate chemical reactions between the support pin 229 and the substrate. Additionally, the coating material may minimize friction with the substrate to reduce breakage or chipping. Suitable coatings include nitride type materials, such as silicon nitride, titanium nitride, and tantalum nitride, for example. A more detailed description of such support pins and coatings may be found in U.S. Pat. No. 6,528,767, which is incorporated by reference herein in that regard.

In one or more embodiments, a support pin 229 may be a two piece system having a mounting pin disposed on the upper surface of the support tray 224, 226, and a cap disposable on the mounting pin. The mounting pin is preferably made of a ceramic material. The cap includes a hollow body to receive the mounting pin. The upper portion of the cap may be rounded and smoothed as discussed above. Similarly, the cap may be coated as described above. A more detailed description of such a two piece system may also be found in U.S. Pat. No. 6,528,767, which is incorporated by reference herein in that regard.

In one or more embodiments, an upper portion of a support pin 229 may include a socket that retains a ball movable within the socket. The ball makes contact with and supports the substrate. The ball is allowed to rotate and spin, much like a ball bearing, within the socket allowing the substrate to move across the ball without scratching. The ball is generally constructed of either metallic or non-metallic materials that provide friction reduction and/or inhibit chemical reaction between the ball and the substrate. For example, the ball may include a metal or metal alloy, quartz, sapphire, silicon nitride or other suitable non-metallic materials. Preferably, the ball has a surface finish of 4 micro-inches or smoother. The ball may further include the coating describe above. A more detailed description of such a support pin may be found in U.S. Pat. No. 6,528,767, which is incorporated by reference herein in that regard.

Alternatively, a support pin 229 may be a two piece system having a mounting pin disposed on an upper surface of the support tray 222 or 226, and a cap disposable on the mounting pin, whereby the cap includes the socket and ball configuration described above. A more detailed description of such a ball and socket may be found in co-pending U.S. patent application Ser. No. 09/982,406, as well as Ser. No. 10/376,857, both entitled "Substrate Support", and both assigned to Applied Materials, Inc. Both co-pending applications are incorporated by reference herein in that regard.

Further, a support pin 229 may include a housing having one or more roller assemblies and a support shaft at least partially disposed therein. The support shaft is able to move axially through the housing as well as rotate within the housing to reduce wear and tear on the pin head during loading and unloading of a substrate supported thereon. A support pin 229 may also include a housing having one or more ball assemblies and a support shaft at least partially disposed therein. The ball assemblies include one or more spherical members that are held into place by a sleeve that is at least partially disposed about the housing. The one or more spherical members contact the shaft and allow the shaft to move axially as well as radially within the housing. This also reduces wear and tear on the pin head during loading and unloading of a substrate supported thereon. A more detailed description of such support pins may be found in commonly assigned and co-pending U.S. patent application, Ser. No. 10/779,130 entitled "Support Bushing for Flat Panel Substrates," which is incorporated by reference herein in that regard.

Referring again to the embodiment shown in FIG. 2, the chamber body 202 includes at least two sealable ports 204A, 204B formed through a sidewall 208 and at least two sealable ports 206A, 206B formed through a sidewall 210. In the embodiment shown, the sidewalls 208 and 210 oppose one another and are parallel or substantially parallel. However, other arrangements are conceivable including adjoining, perpendicular sidewalls, for example.

Each port 204A, 204B, 206A, 206B is selectively sealable by a slit valve 207A or an I/O door 207B (shown in FIG. 1) to isolate an interior environment of the chamber body 202. The set of ports 204A, 204B may couple the interior of the load lock chamber 200 to a factory interface, such as a substrate queuing system or some other processing system (not shown) via an I/O door 207B, for example. The set of ports 206A, 206B is disposed between the load lock chamber 200 and the transfer chamber 300 to facilitate substrate transfer therebetween via the slit valves 207A.

The load lock chamber 200 may also include a heater and/or cooler disposed therein to control the temperature of the substrates positioned within the load lock chamber 200. For example, one or more heating plates and one or cooling plates (not shown) may be attached to or embedded within the substrate support trays 224, 226. Also for example, a heat exchanger (not shown) may be disposed within or attached to the sidewalls of the chamber body 202. Alternatively, a non-reactive gas, such as nitrogen for example, may be passed through the load lock chamber 200 to regulate the temperature therein.

Accordingly, the load lock chamber 200 may function as an isolated processing environment that is capable of being heated or cooled as well as pressurized or de-pressurized, depending on system requirements. Consequently, the load lock chamber 200 enables the transfer of substrates into and out of the testing system 100 without exposure to outside contaminants.

Referring again to FIG. 1, the transfer chamber 300 is disposed adjacent the testing chamber 400. The transfer chamber 300 includes a transfer robot 310 having a range of motion in at least an X/Z coordinate system. As such, the transfer robot 310 enables substrate transfer between the load lock chamber 200 and the testing chamber 400.

Figure 3:
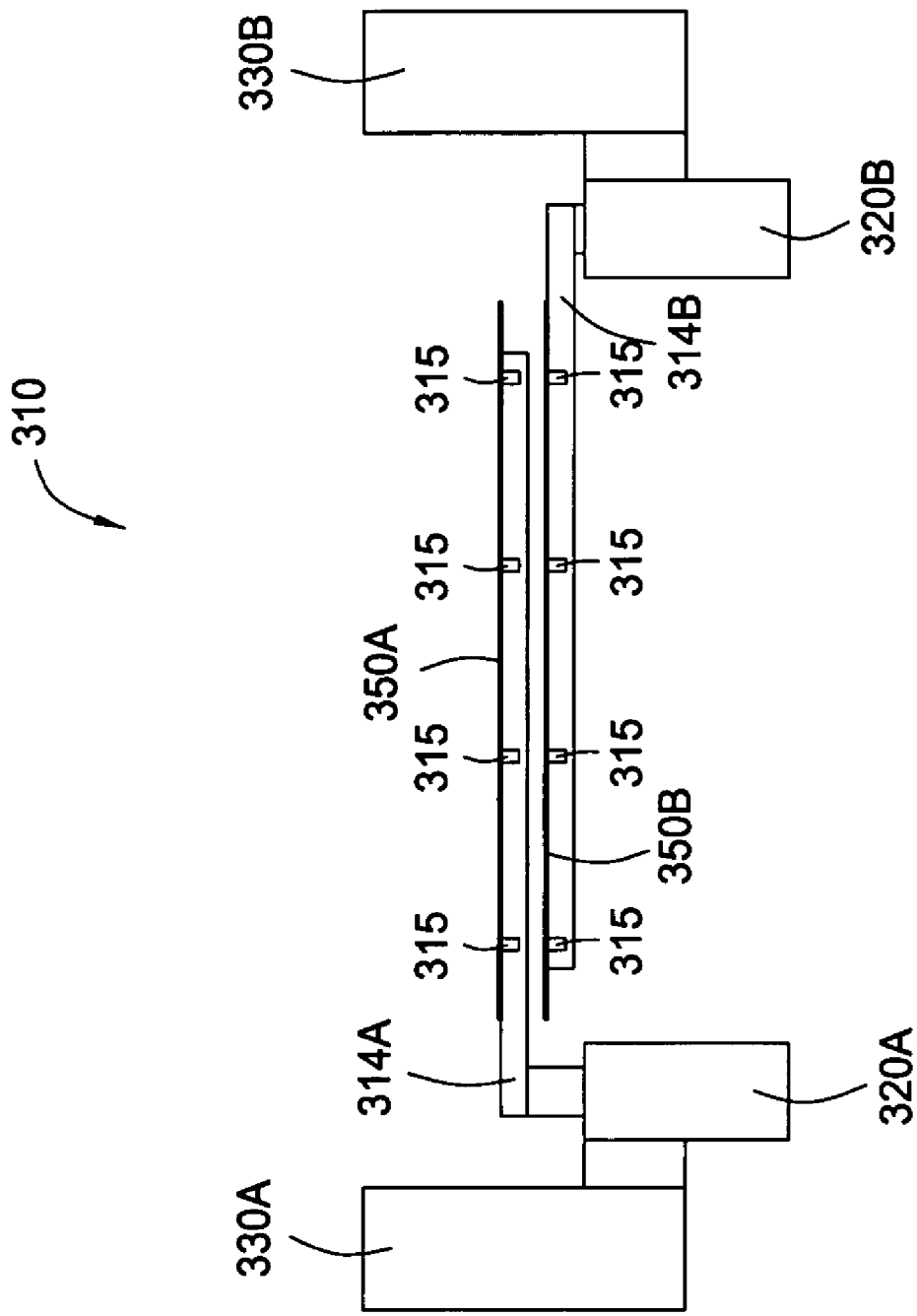
FIG. 3 shows an end perspective view of a robot disposed within the transfer chamber of FIG. 1.

FIG. 3 shows an end perspective view of an illustrative robot 310. In one embodiment, the robot 310 includes one or more end effectors or arms. Preferably, the robot 310 has two end effectors arranged one on top of another, such as a first end effector 314A and a second end effector 314B as shown. In the embodiment shown, the first end effector 314A is vertically arranged above the second end effector 314B. However, the first and second end effectors 314A and 314B are capable of traversing or crossing vertical paths with one another so that the second end effector 314B may be located in an "upper" position relative to the first end effector 314A, as will be described in more detail below.

The end effectors 314A, 314B may have a planar or substantially planar upper surface on which a substrate 350A, 350B may be supported. In one or more embodiments, each end effector 314A, 314B has four fingers 315 that are evenly spaced, which contact and support a substrate 350A, 350B when placed thereon. The actual number of fingers 315 and the spacing between the fingers 315 are a matter of design and is well within the skill of one in the art to determine the appropriate number of fingers 315 and spacing for a particular substrate.

The first end effector 314A is coupled to a first rail or support 320A that is disposed along the X-axis of the transfer chamber 300. The second end effector 314B is coupled to a second rail or support 320B that is also disposed along the X-axis of the transfer chamber 300. The first and second rails 320A and 320B are parallel and are preferably disposed along an inner surface of the sidewalls of the transfer chamber 300. The first and second rails 320A and 320B are connected to a drive system (not shown in this view). Illustrative drive systems may include, but are not limited to, any linear actuator, pneumatic cylinder, hydraulic cylinder, magnetic drive, stepper motor, or servo motor, for example.

Each rail 320A and 320B facilitates independent movement of the end effectors 314A and 314B in the "X-direction" within the test system 100. This reference to an "X-direction" is depicted in the insert shown in FIG. 3. In operation, the end effectors 314A and 314B are actuated in a manner that extends and retracts the end effectors 314A and 314B in the X-direction to facilitate substrate movement between the transfer chamber 300 and the load lock chamber 200 or between the transfer chamber 300 and the testing chamber 400.

Each end effector 314A and 314B may also move vertically within the test system 100. Still referring to FIG. 3, the rails 320A and 320B are coupled to one or more lift mechanisms or risers 330A and 330B to facilitate vertical movement of the rails 320A and 320B and the end effectors 314A and 314B. The risers 330A and 330B are actuated to lift or lower the rails 320A and 320B and thus, the end effectors 314A and 314B travel vertically within the transfer chamber 300. The risers 330A and 330B may be connected to any type of drive system known in the art. Illustrative drive systems may include, but are not limited to, any linear actuator, pneumatic cylinder, hydraulic cylinder, magnetic drive, stepper motor, or servo motor, for example.

The motion of the risers 330A and 330B may be synchronized such that the end effectors 314A and 314B move together. Further, the risers 330A and 330B may be actuated independently of one another. The risers 330A and 330B may be actuated independently so the end effectors 314A and 314B can traverse one another, i.e. so the end effectors 314A and 314B can vertically cross paths. For example, the first end effector 314A may be positioned at an elevation adjacent the testing chamber 400 while the second end effector 314B may be positioned at an elevation adjacent one of the trays 224 or 226 within the load lock chamber 200.

Referring again to FIG. 1, the first end effector 314A may extend from the transfer chamber 300 into one of the trays 224 or 226 of the load lock chamber 200 to retrieve a substrate to be tested. Similarly, the second end effector 314B may extend into one of the trays 224 or 226 of the load lock chamber 200 to retrieve a substrate to be tested. The risers 320A, 320B are actuated to lift and lower the end effectors 314A, 314B having the substrates 350A, 350B disposed thereon between the elevation of the testing chamber 400 and the load lock chamber 200.

In one particular sequence, the first end effector 314A retrieves an untested substrate 350A or 350B from one of the trays 224 or 226 of the load lock chamber 200. The risers 320A, 320B are actuated to lift the end effectors 314A and 314B adjacent the testing chamber 400. The first end effector 314A extends to retrieve a tested substrate (not shown) from the testing chamber 400. The risers 320A, 320B are actuated again so the second end effector 314B can place the untested substrate in the testing chamber 400. The risers 320A, 320B are then actuated to lower the end effectors 314A and 314B adjacent the load lock chamber 200. The first end effector 314A, having the tested substrate thereon, then extends to deliver the tested substrate to an empty tray 224 or 226 of the load lock chamber 200. Next, the risers 320A, 320B are actuated so the second effector 314B can retrieve another untested substrate from an occupied tray 224 or 226 within the load lock chamber 200.

The above sequence is then repeated until testing of all substrates is complete. The above operation is for illustrative purposes only. Many different substrate handling sequences can be easily envisioned and accomplished using the robot 310 described.

Figure 4:
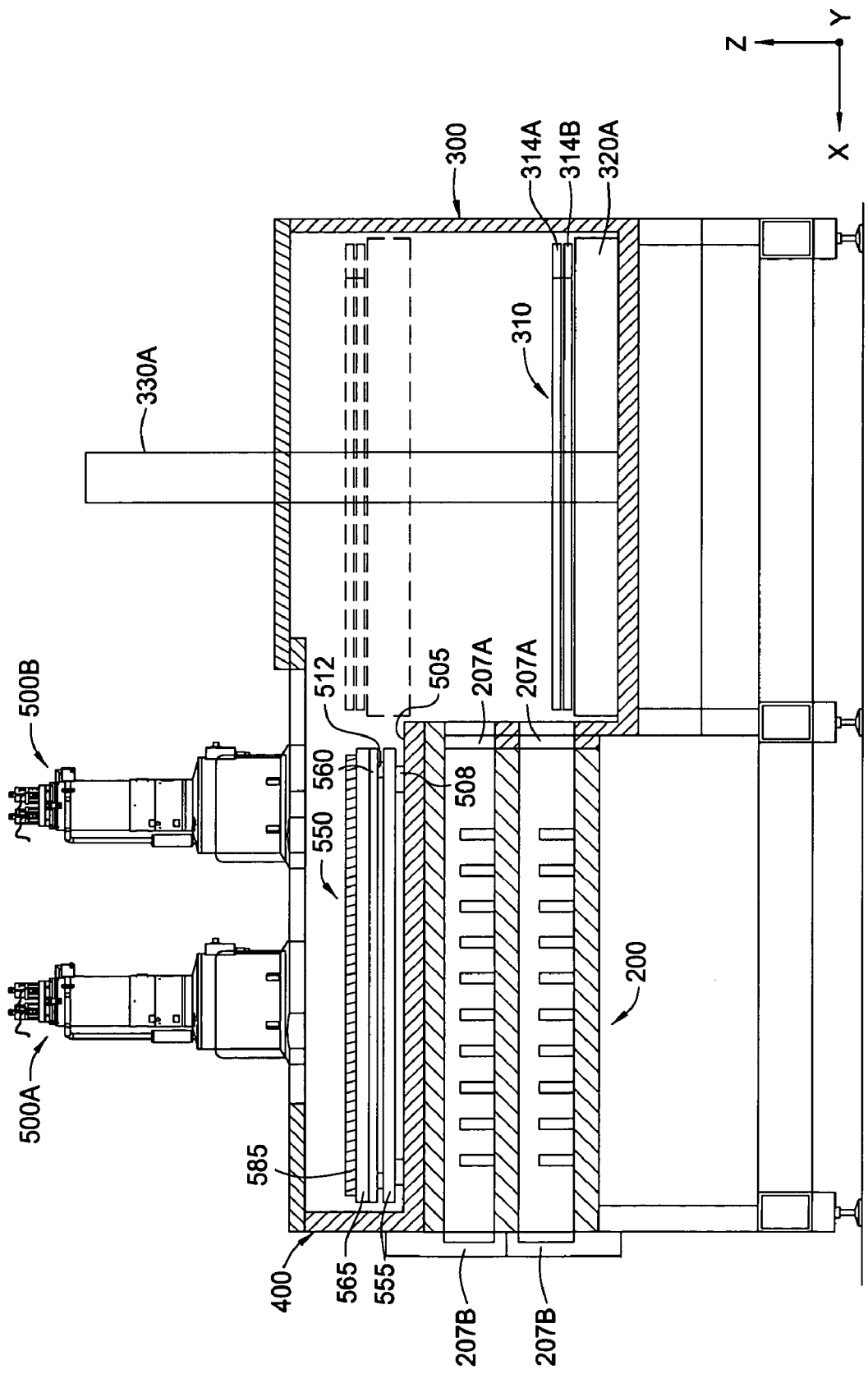
FIG. 4 shows an enlarged, partial cross section view of the testing chamber of FIG. 1.

FIG. 4 is similar to FIG. 1, but shows an enlarged, schematic view of an illustrative substrate table 550 positioned within the testing chamber 400. In one or more embodiments, the substrate table 550 includes a first stage 555, a second stage 560 and a support stage 565 that are all planar monoliths or substantially planar monoliths, stacked on one another. In one or more embodiments, each of the two stages 555, 560, move independently along orthogonal axes, such as an X-axis and a Y-axis, for example. For simplicity and ease of description, the first stage 555 will be further described below as representing the stage that moves along the X-axis in an "X-direction" and will be referred to as the "lower stage 555." Also for simplicity and ease of description, the second stage 560 will be further described below as representing the stage that moves along the Y-axis in a "Y-direction" and will be referred to as the "upper stage 560." References to an "X-axis," "X-direction," "Y-axis," and "Y-direction" are for convenience only and made in regard to the relative directions identified within the insert shown in FIGS. 4–6.

Figure 5:
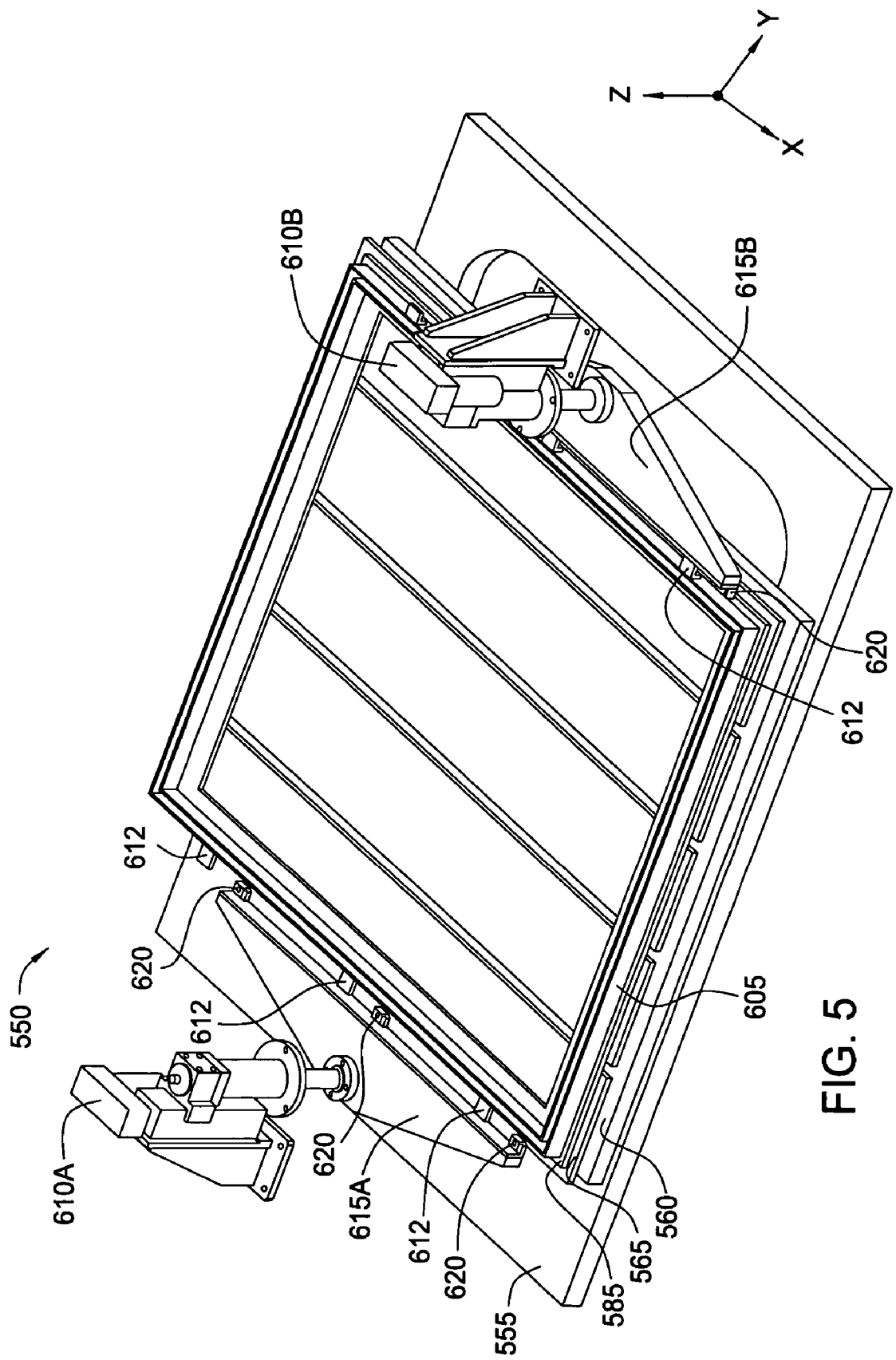
FIG. 5 shows an enlarged perspective view of a substrate table within the testing chamber of FIGS. 1 and 4.

FIG. 5 shows an enlarged perspective view of the substrate table 550. Referring to FIGS. 4 and 5, the lower stage 555 and the upper stage 560 both move horizontally, but move in a direction orthogonal or substantially orthogonal to one another. As mentioned above, the lower stage 555 independently moves side to side in the X-direction, and the upper stage 560 independently moves forward and backward in the Y-direction. The independent movement of the lower stage 555 translates to the upper stage 565. As such, the upper stage 560 moves with the lower stage 555 in the X direction and moves independently of the lower stage 555 in the Y direction. The result being that the upper stage 560 travels in both X and Y directions. The stage 565 also moves in both X and Y directions since the support stage 565 rests on the upper stage 560.

Considering the stages 555 and 560 in more detail, the lower stage 555 may be coupled to a lower surface 505 of the testing chamber 400 through a first drive system 508 (shown in FIG. 4). The first drive system 508 moves the lower stage 555 along the X-axis. Similarly, the upper stage 560 may be coupled to an upper surface of the lower stage 555 through a second drive system 512, which moves the upper stage 560 along the Y-axis. The first drive system 508 is capable of moving the substrate table 550 in the X-direction by at least 25 percent of the width or first side of the substrate 350. Likewise, the second drive system is capable of moving the substrate table 550 in the Y-direction by at least 25 percent of the length or second side of the substrate 350. The first and second drive systems may be any motion device capable of repeatedly and precisely moving the stages 555, 560. Illustrative drive systems may include, but are not limited to, any linear actuator, pneumatic cylinder, hydraulic cylinder, magnetic drive, stepper motor, or servo motor, for example.

Considering the support stage 565 in more detail, the support stage 565 has a planar or substantially planar upper surface to contact and support the substrate 350 within the testing chamber 400. In one or more embodiments, the support stage 565 is slotted or segmented, as shown in FIG. 5. Each segment of the support stage 565 sits adjacent to the fingers 315 of the end effectors 314A, B of the robot 310 when extended into the testing chamber 400 as shown. As such, the support stage 565 and the end effectors 314A, 314B can interdigitate on the same horizontal plane. As such, this configuration allows the end effector 314A, 314B to move within the segmented slots of the support stage 565.

Accordingly, the spacing between the segments of the support stage 565 corresponds to the width of the fingers 315 of the end effectors 314A, 314B plus some additional measure to assure clearance. Preferably, the support stage 565 has four or more segments, although the support stage 565 may have any number of segments to correspond to the number of fingers 315 of the end effectors 314A, 314B. The number of fingers 315 of the end effectors 314A, 314B are a matter of design and often depend on the size and thus weight of the substrates to be supported thereon.

Referring again to FIGS. 1 and 4, the test system 100 also includes one or more test columns 500 disposed on an upper surface of the testing chamber 400. Two test columns 500A, 500B are shown. In one or more embodiments, four test columns may be used. In a four test column arrangement, a substrate to be tested has only to move one-fourth of its width, both ways, in a first direction (i.e. the X-direction) and one-fourth of its length, both ways, in a second direction (i.e. Y-direction). In other words, each test column 500 is arranged above a separate quadrant of the substrate surface to be tested, and is only responsible for testing its respective quadrant. As such, the size of the testing chamber 400 and consequently the foot print of the test system 100, are dramatically reduced. Additional test columns 500 may be added to further reduce the distance for which the substrate to be tested has to move, thereby further reducing the size of the testing chamber 400 and the foot print of the test system 100. Regardless of the number of columns 500 used, the drive systems 508, 512 should have a range of motion that allows all of the surface area of a substrate disposed within the testing chamber 400 to be positioned below any one of the test columns 500 during testing.

Still referring to FIG. 5, a prober frame 605 may be disposed above an upper surface of the support stage 565. In one or more embodiments, the prober frame 605 may be moved vertically using a drive system. The drive system may include two or more screw-type actuators 610A, 610B that are each connected to a lift member 615A, 615B. In one or more embodiments, each lift member 615A, 615B includes one or more support members 620 attached thereto. The prober frame 605 may include one or more lift tabs 612 formed thereon that engage the support members 620 of the lift members 615A, 615B. In operation, the actuators 610A, 610B vertically move the lift plates 615A, 615B up or down which coordinates movement of the prober frame 605 via the interaction of the support members 620 and the lift members 615A, 615B.

Figure 6:
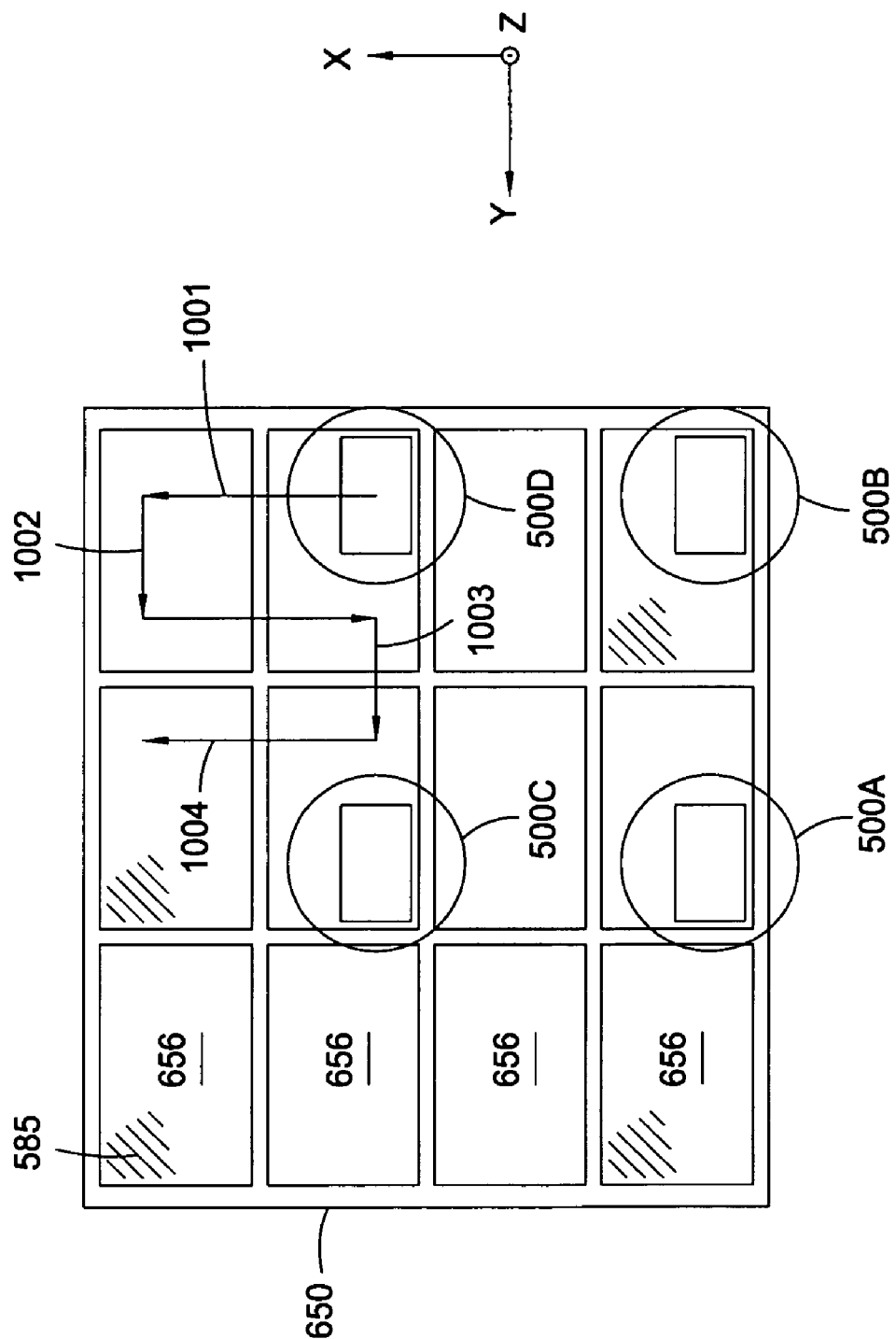
FIG. 6 shows an exemplary prober and testing pattern.

A prober (not shown) may be placed and supported within the prober frame 605. FIG. 6 shows an exemplary prober 650. The prober 650 generally has a picture frame configuration, having sides at least partially defining at least one window or display 656 through which the columns 500A, 500B, 500C, 500D interact with the substrate 585. Each window 656 is positioned to allow a predefined field of pixels (or other device) formed on the substrate 585 to be exposed to the electron beam generated by the columns 500A, 500B, 500C, 500D. Accordingly, the number, size and positions of the windows 656 in a particular prober 650 are chosen based upon the layout of the substrate 585 and the devices on the substrate 585 to be tested.

A face of the prober 650 contacts the substrate 585 and may include a plurality of electrical contact pads that are coupled to a controller (not shown). The electrical contact pads are positioned to provide electrical connection between a predetermined pixel (or other device) formed on the substrate 585 and the controller. Thus, as the substrate 585 is urged against the prober 650, electrical contact between the controller and the devices on the substrate 585 are made through the contact pads on the prober 650. This allows the controller to apply a voltage to a selected pixel or to monitor each pixel for changes in attributes, such as voltage, during testing.

Still referring to FIG. 6, the substrate table 550 positions the substrate 585 and the prober 650 so that the columns 500A, 500B, 500C, 500D can test the substrate 585 by sequentially impinging at least one electron beam emitted from the columns 500A, 500B, 500C, 500D on discrete portions or pixels composing the thin film transistor matrix. After a pixel is tested, the substrate table 550 moves the substrate 585 to another discrete position within the testing chamber 500 so that another pixel on the substrate 585 surface may be tested.

An exemplary testing pattern having twelve different test locations is shown in FIG. 6. The discrete portion of the substrate surface under each column 500A, 500B, 500C, 500D represents one test location. As shown, the substrate 585 is moved along the X-axis as shown by arrow 1001 and tested in four locations under columns 500A, 500B, 500C, and 500D. The substrate 585 is then moved along the Y-axis as shown by arrow 1002 and tested in four different locations. The substrate 585 is then moved and tested as shown by arrows 1003 and 1004 until the entire surface of the substrate 585 or the desired portions of the substrate surface have been tested using the desired electron beam test method. As mentioned above, the substrate 585 has to only travel one-fourth of its width in a first direction and one-fourth of its length in a second direction so that the entire surface of the substrate 585 gets exposed to at least one column 500A, 500B, 500C, or 500D.

The operation of the test columns 500A, 500B, 500C, 500D (i.e. electron beam testing) may employ several test methods. For example, the electron beam may sense pixel voltages in response to the voltage applied across the pixels or the pixel through the electrical connections in the prober 650. Alternatively, a pixel or a plurality of pixels may be driven by the electron beam which provides a current to charge up the pixel(s). The pixel response to the current may be monitored by the controller (not shown) that is coupled across the pixel by the prober 650 to provide defect information. Examples of electron beam testing are described in U.S. Pat. No. 5,369,359, issued Nov. 29, 1994 to Schmitt; U.S. Pat. No. 5,414,374, issued May 9, 1995 to Brunner et al.; U.S. Pat. No. 5,258,706, issued Nov. 2, 1993 to Brunner et al.; U.S. Pat. No. 4,985,681, issued Jan. 15, 1991 to Brunner et al.; and U.S. Pat. No. 5,371,459, issued Dec. 6, 1994 to Brunner et al., all of which are hereby incorporated by reference in therein entireties. The electron beam may also be electromagnetically deflected to allow a greater number of pixels to be tested at a given substrate table 550 position.

Figure 7:
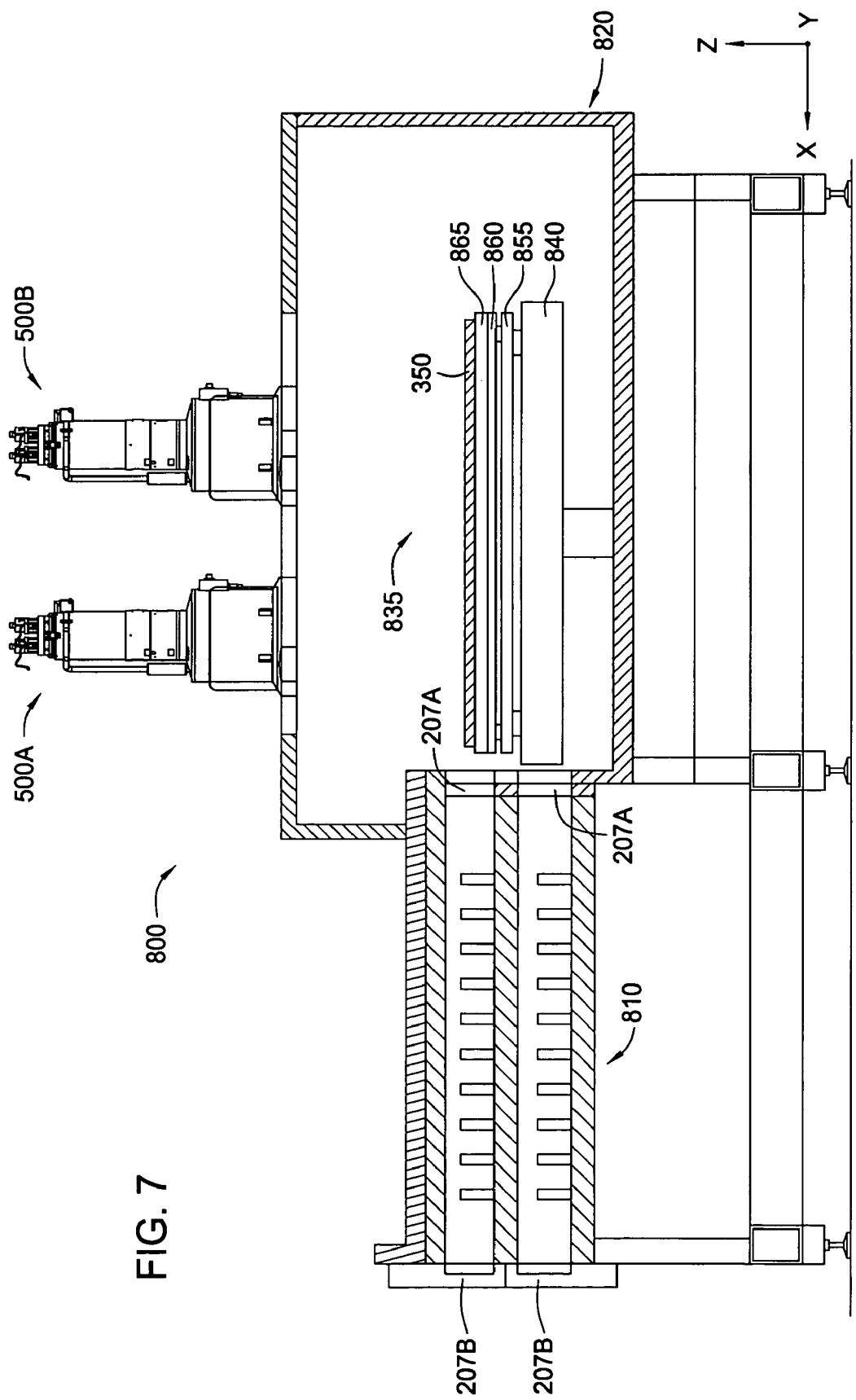
FIG. 7 shows an alternative electronic test system utilizing a load lock chamber and an integrated test/transfer chamber.

FIG. 7 shows an alternative test system 800 that includes a load lock chamber 810, and an integrated test/transfer chamber 820. In this configuration, the load lock chamber 810 is disposed adjacent the test/transfer chamber 820. The lock chamber 810 may be the same as the load lock chamber 200 described above except for its position relative to the test columns 500. As shown in FIG. 7, the test columns 500 are disposed above the integrated test/transfer chamber 820. As such, a separate testing chamber has been eliminated.

In this embodiment, the integrated test/transfer chamber 820 includes a substrate table 835 that can move vertically to effectuate substrate transfer to and from the load lock chamber 810 and that can move vertically to position the substrate disposed thereon (not shown in this view) to a testing position near the test columns 500. In one or more embodiments, the substrate table 835 rests on a support pedestal 840 that provides this vertical movement of the substrate table 835 within the test/transfer chamber 820. The pedestal 840 may be connected to any motion device, such as a linear actuator, a pneumatic cylinder, a hydraulic cylinder, a magnetic drive, a stepper or servo motor, or any other lifting device known in the art.

The substrate table 835 includes a first stage 855, a second stage 860, and a third stage 865 that are planar monoliths or substantially planar monoliths, stacked on one another. In one or more embodiments, the first stage 855 and the second stage 860 move independently along orthogonal or substantially orthogonal axes. For example, the first stage 855 moves along the X-axis in the X-direction and will be referred to as the "lower stage 855," and the second stage 860 moves along the Y-axis in the Y-direction and will be referred to as the "upper stage 860." The "X-axis" and the "Y-axis" are depicted within the insert shown in FIGS. 7–13. The third stage 865 is disposed on an upper surface of the second stage 860 and moves therewith. The third stage 865 or "support stage 865" also has a planar or substantially planar upper surface to contact and support a substrate (not shown) to be tested. As described above, the second stage 860 moves independently in the Y-direction, and moves with the first stage 855 in the X-direction. Similarly, the third stage 865 moves with the second stage 860 in the Y-direction, which are both moved in the X-direction by the first stage 855.

Figure 8:
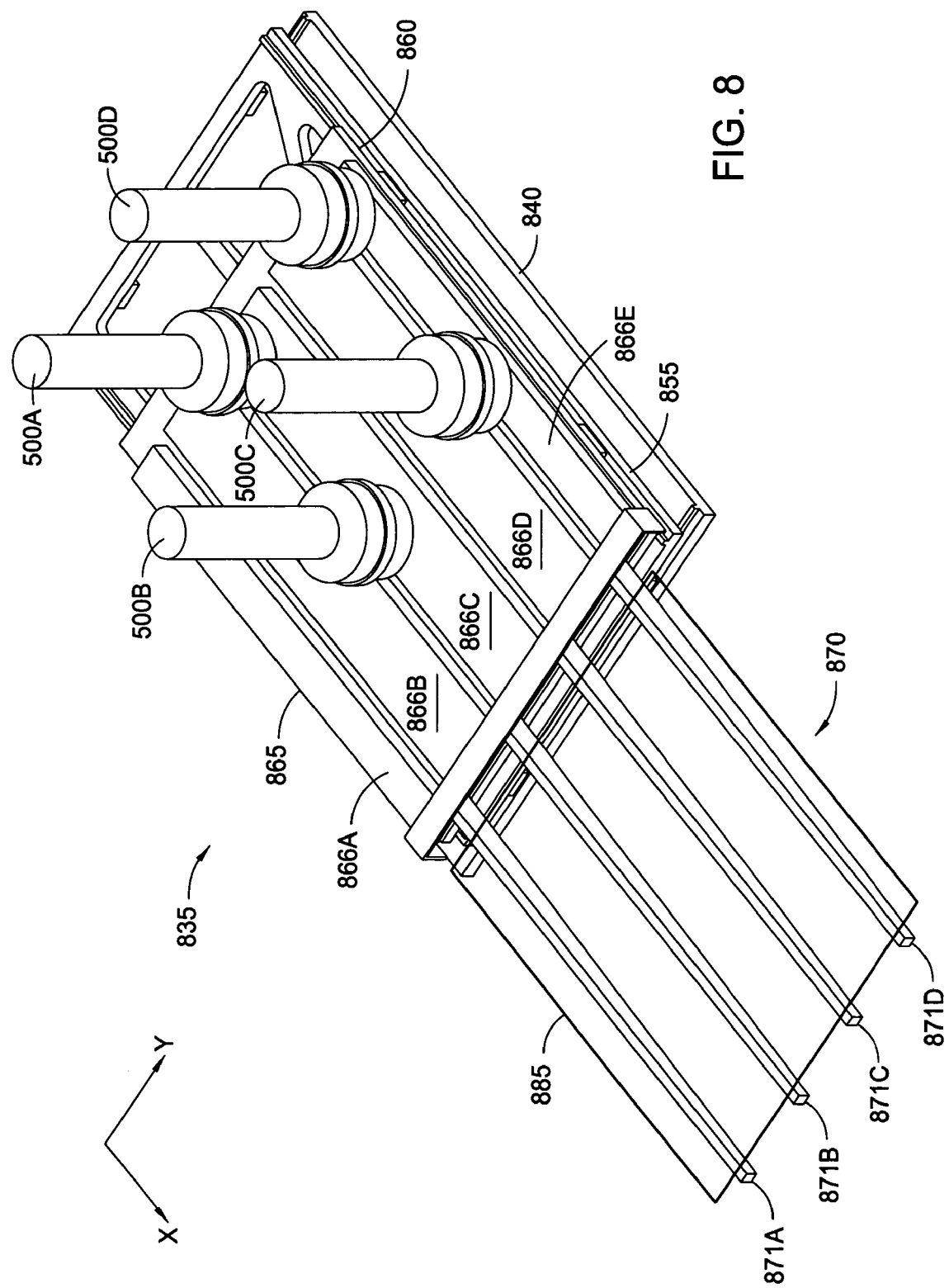
FIG. 8 shows an enlarged, schematic view of a substrate table within the integrated test chamber of FIG. 7.

FIG. 8 shows a schematic view of the substrate table 835. The substrate table 835 further includes an end effector 870. As shown, the end effector 870 has a planar or substantially planar upper surface on which the substrate 885 may be supported. In one or more embodiments, the end effector 870 is a slotted monolith. In one or more embodiments, the end effector 870 includes four fingers 871A, 871B, 871C, 871D that are evenly spaced, and that may contact and support the substrate 885 when placed thereon. The actual number of fingers 871A, 871B, 871C, 871D is a matter of design and is well within the skill of one in the art to determine the appropriate number of fingers needed for the size of substrate to be manipulated.

Still referring to FIG. 8, the support stage 865 is slotted or segmented such that each segment 866A, 866B, 866C, 866D, 866E of the support stage 865 sits adjacent the fingers 871A, 871B, 871C, 871D of the end effector 870. As such, the support stage 865 and the end effector 870 can interdigitate on the same horizontal plane. This configuration allows the end effector 870 to move freely in the Y-direction within the segmented slots of the support stage 865. As such, transfer of the substrate 885 between the load lock chamber 810 and the integrated test/transfer chamber 820 is facilitated via the end effector 870. Additional details of the substrate table 835 are shown and described in co-pending U.S. patent application Ser. No. 10/778,982, which is incorporated by reference in that regard.

Figure 9:
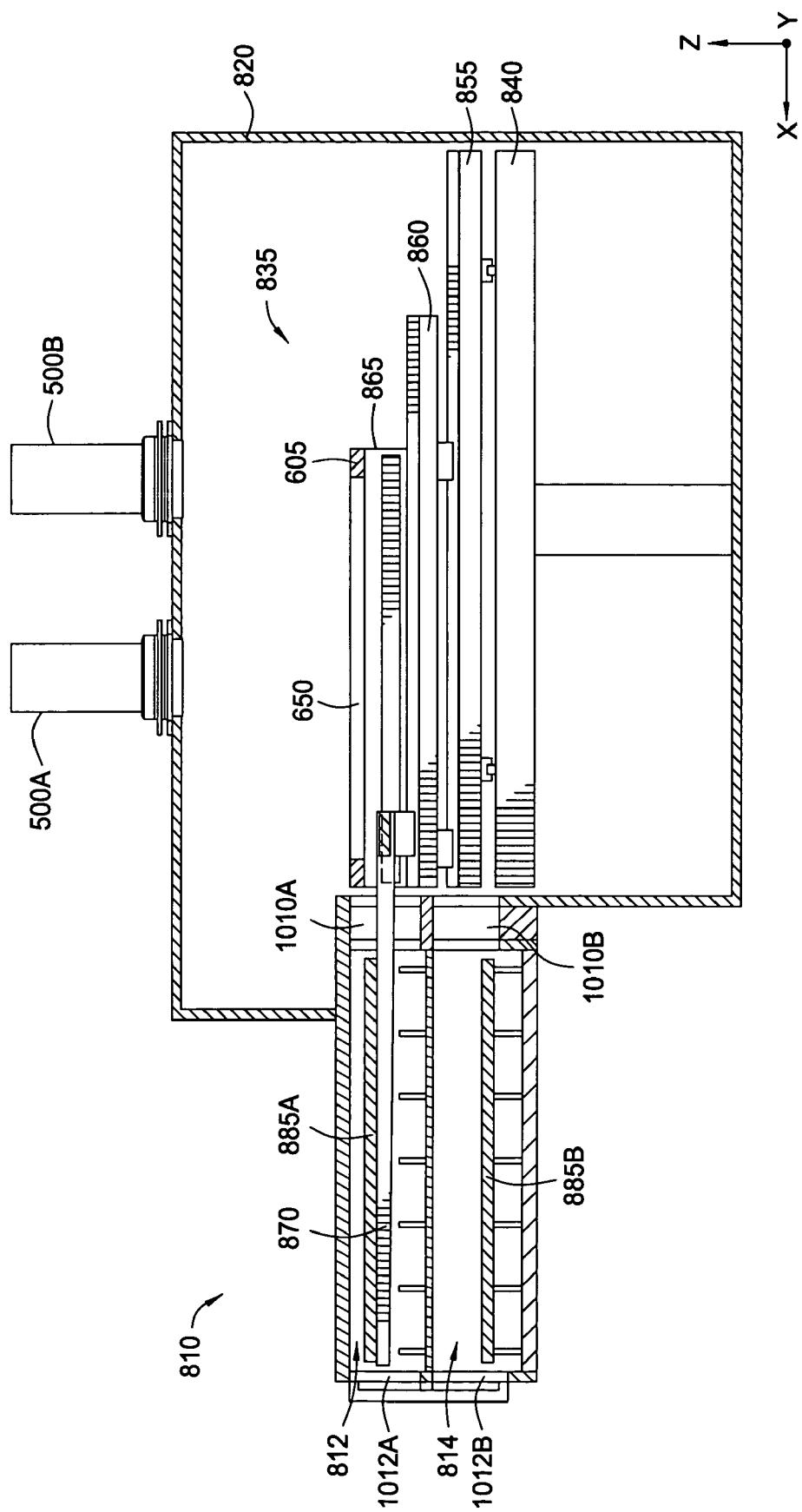
FIGS. 9–13 show an illustrative sequential operation of the support table of FIG. 7.
Figure 10:
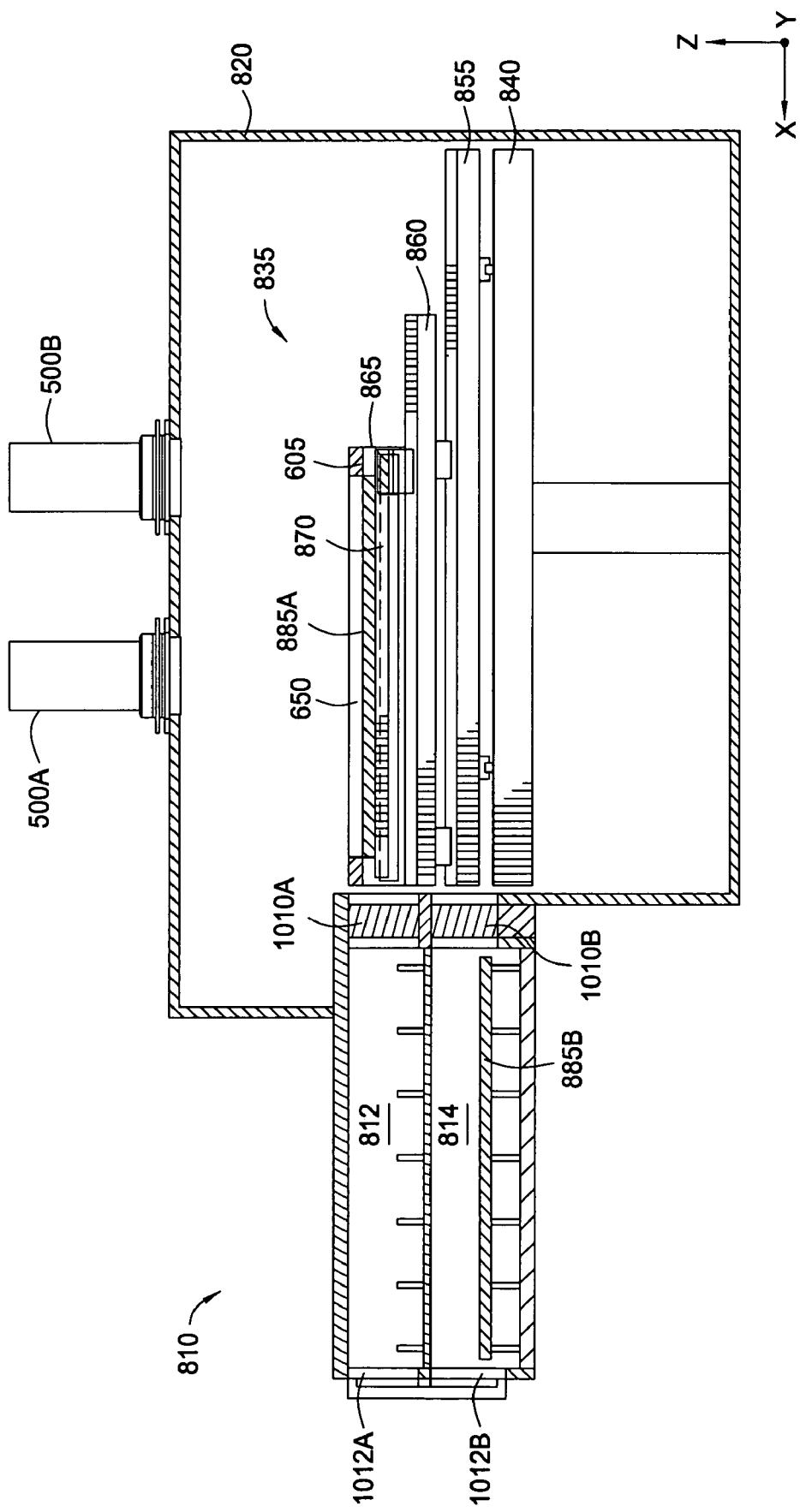

FIGS. 9–13 show partial cross section views of the load lock chamber 810 and the integrated test/transfer chamber 820 to illustrate the sequence of operation of the substrate table 835. As shown in FIG. 9, the pedestal 840 locates the substrate table 835 at an elevation relative to either the upper slot 812 or the lower slot 814 of the load lock chamber 810. The slit valve 1010A between the load lock chamber 810 and the test/transfer chamber 820 opens, and the end effector 870 extends into the load lock chamber 810 to retrieve an untested substrate 885A. The pedestal 840 may be lifted slightly to allow the end effector 870 to lift the substrate 885A from the tray 224. The end effector 870 having the untested substrate 885A disposed thereon then retracts into the test/transfer chamber 820 and the slit valve 1010A is closed. The retracted end effector 870 locates the substrate 885A on the upper surface of the third stage 865, thereby completing the transfer of the untested substrate 885A from the load lock chamber 810 to the substrate table 835, as shown in FIG. 10.

Figure 11:
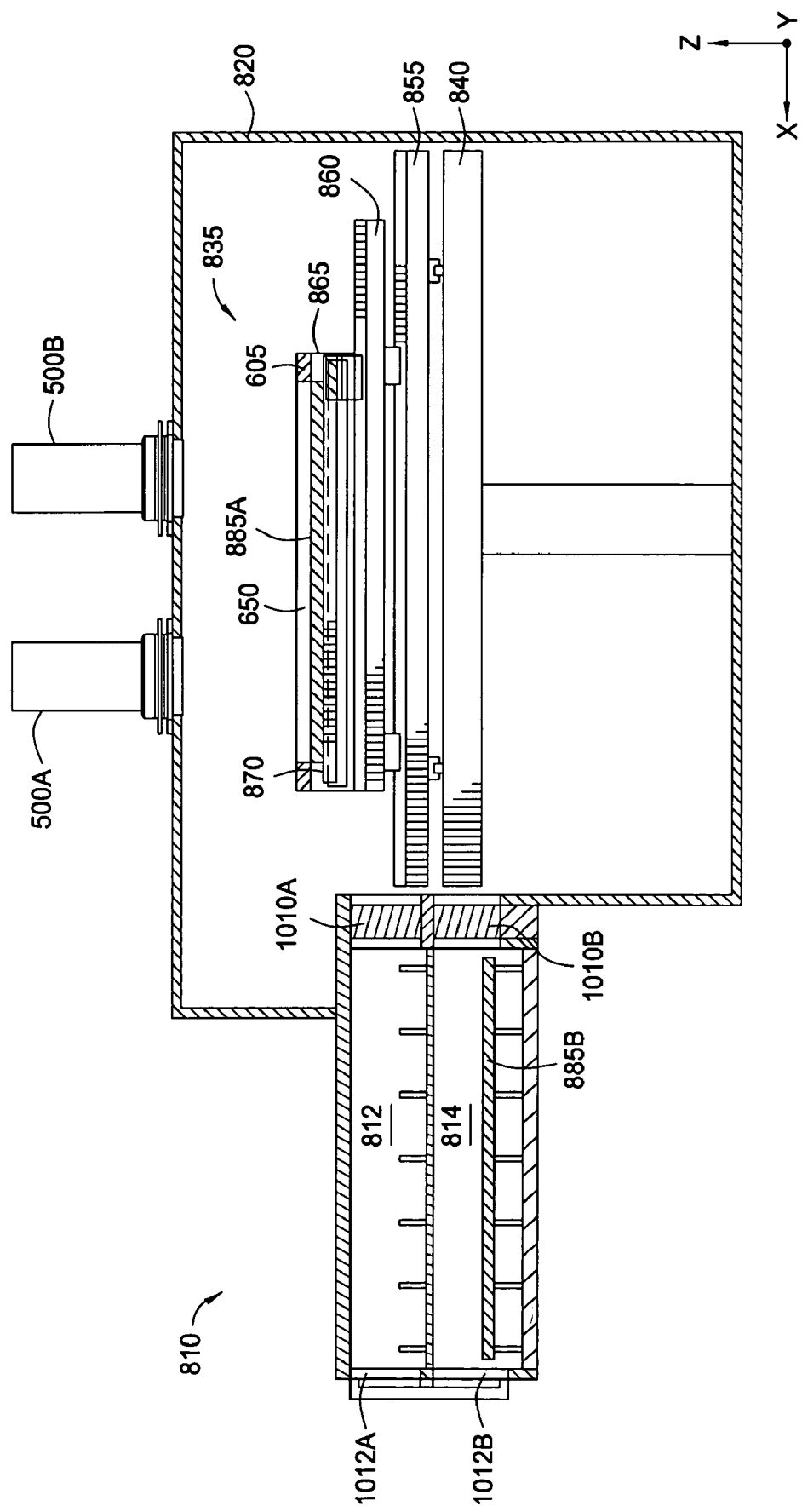

The pedestal 840 having both the substrate table 835 and the substrate 885A loaded thereon then lifts to locate the substrate 885A in closer proximity to the testing columns 500A–D, as shown in FIG. 11. During testing, the first stage 855 and the second stage 860 move linearly in their respective directions to place discrete portions of the substrate 885A below at least one of the testing columns 500A, 500B, 500C, 500D, as described above (only two columns are shown in this view). Also during testing, the I/O doors 1012A, 1012B open so that a factory robot (not shown) may retrieve a tested substrate 885B from the lower slot 814 and load an untested substrate 886A into the upper slot 812.

Figure 12:
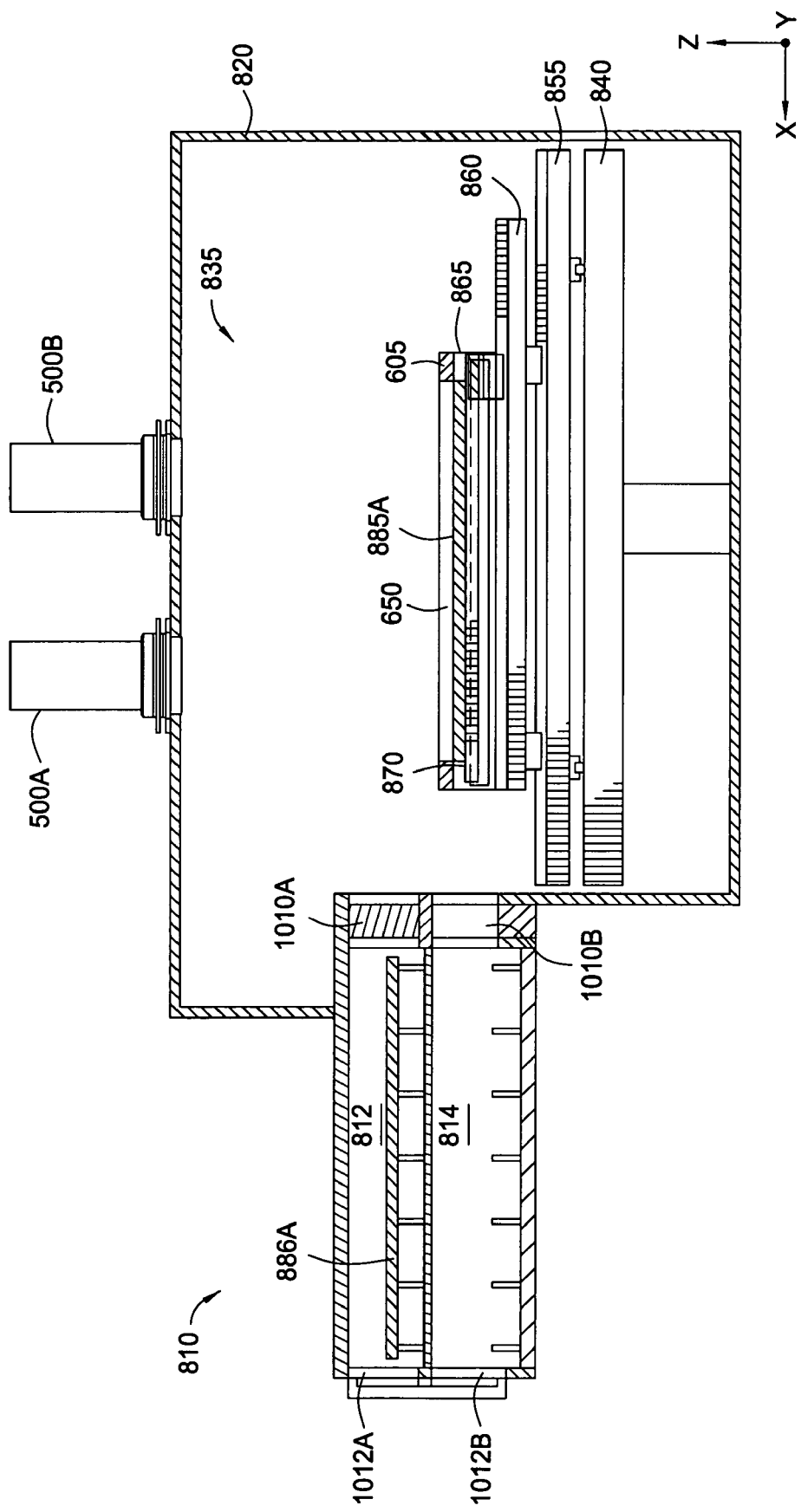
Figure 13:
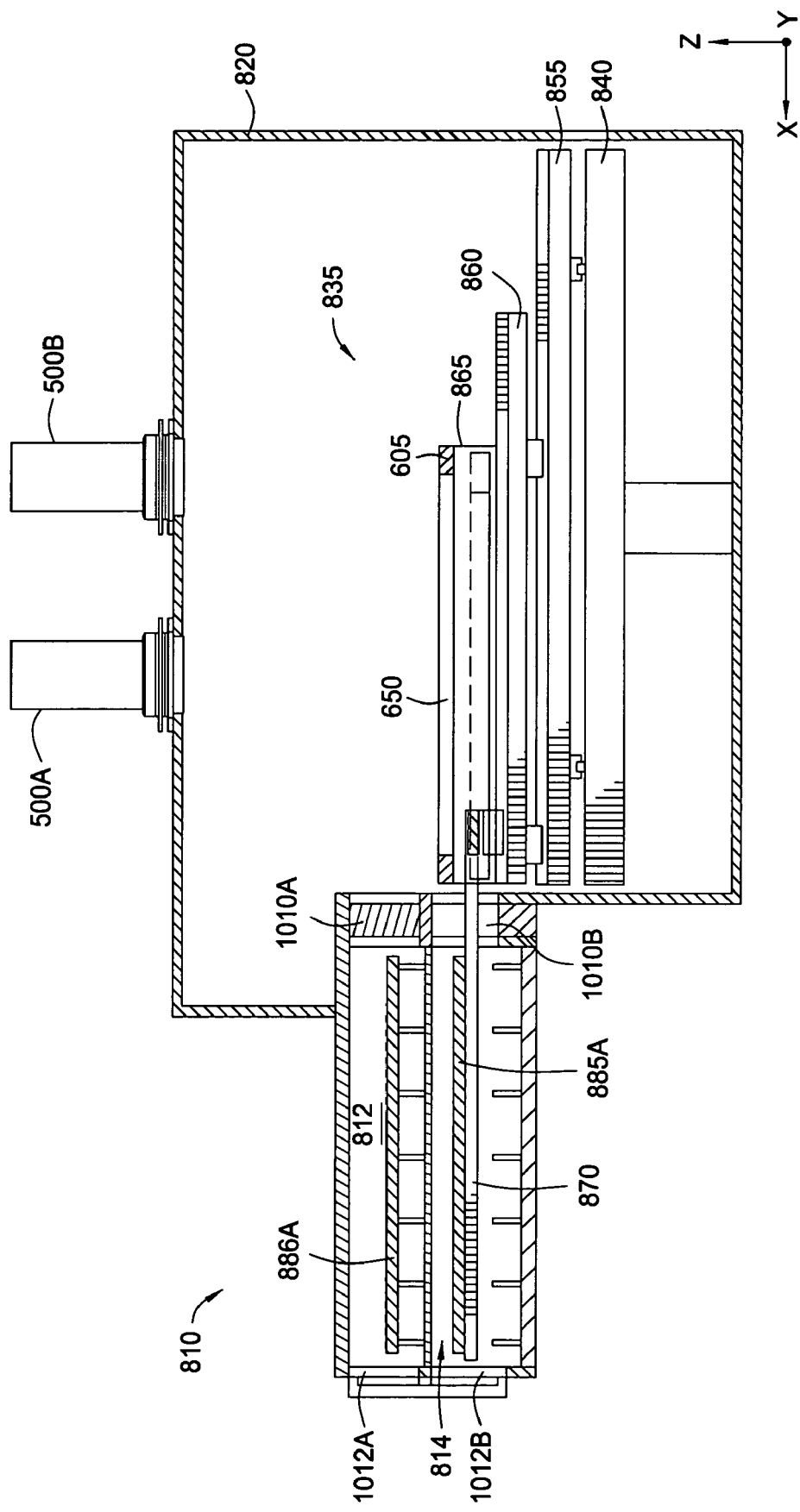

Once testing is complete, the slit valve 1010B is opened and the pedestal 840 is lowered to an elevation proximate the open slit valve 1010B, as shown in FIG. 12. The tested substrate 885A is then transferred using the end effector 870 from the substrate table 835 to the empty lower slot 814 within the load lock chamber 810, as shown in FIG. 13. Next, the pedestal 840 moves up to locate the end effector 870 at an elevation proximate the slit valve 1010A and the upper slot 812 having the untested substrate 886A therein. This sequence of steps shown and described with reference to FIGS. 9–13 is then repeated for each substrate to be tested.

While the foregoing is directed to embodiments of the present invention, other and further embodiments of the invention may be devised without departing from the basic scope thereof, and the scope thereof is determined by the claims that follow.

The invention claimed is:

1. A system for testing one or more large substrates, comprising:
  a testing chamber having a substrate table disposed therein, the substrate table being adapted to move a substrate within the testing chamber in linear directions, the substrate table comprising:
    a first stage movable in a first direction; and
    a second stage movable in a second direction, wherein the first and second directions are substantially orthogonal;
  a load lock chamber at least partially disposed below the testing chamber; and
  a transfer chamber coupled to the load lock chamber and the testing chamber, the transfer chamber having a robot disposed therein adapted to transfer the substrates between the load lock chamber and the testing chamber.

2. The system of claim 1, further comprising one or more electron beam testing devices disposed on an upper surface of the testing chamber.

3. The system of claim 2, wherein the one or more electron beam testing devices comprises four devices disposed above the substrate table.

4. The system of claim 1, wherein the first stage and the second stage are adapted to move linearly along a horizontal plane.

5. The system of claim 1, wherein the first stage moves the second stage in the first direction.

6. The system of claim 1, wherein the substrate table further comprises a support stage disposed on an upper surface of the second stage.

7. The system of claim 6, wherein the first stage moves both the second stage and the support stage in the first direction.

8. The system of claim 6, wherein the second stage moves the support stage in the second direction.

9. The system of claim 6, wherein the second stage, the support stage, or both move in both the first and second directions.

10. The system of claim 6, wherein the robot comprises one or more end effectors, each having one or more fingers for supporting a substrate thereon.

11. The system of claim 10, wherein the one or more end effectors move in the first direction.

12. The system of claim 10, wherein the support stage is segmented to receive the one or more fingers of the end effector.

13. The system of claim 1, wherein the load lock chamber comprises a substrate support having at least two support trays.

14. The system of claim 13, wherein the at least two support trays each comprise a plurality of support pins disposed on an upper surface thereof.

15. The system of claim 1, wherein the robot comprises two end effectors, one arranged on top of the other, each end effector having two or more fingers spaced apart for supporting a substrate thereon.

16. The system of claim 15, wherein the two end effectors move in the first direction.

17. The system of claim 15, wherein the two end effectors may be actuated independently such that the end effectors traverse one another and can vertically cross paths.

18. The system of claim 1, wherein the robot comprises one or more lift mechanisms to vertically move the robot within the transfer chamber.

19. The system of claim 1, wherein the load lock chamber, the transfer chamber, and the test chamber are maintained at the same vacuum level.

20. The system of claim 1, wherein the transfer chamber, the load lock chamber, and the testing chamber share a common environment which is maintained at a vacuum condition.

21. A system for testing a large substrate, comprising:
a testing chamber having a substrate table disposed on a vertically movable pedestal assembly, the substrate table, comprising:
a first stage movable in a first direction;
a second stage movable in a second direction, wherein the first and second directions are substantially orthogonal;
an end effector adapted to transfer the substrate between a load lock chamber and the substrate table, wherein the load lock chamber is disposed adjacent the testing chamber; and
one or more test devices disposed on an upper surface of the testing chamber.

22. The system of claim 21, wherein the first and second stages are adapted to move linearly.

23. The system of claim 21, wherein the substrate table further comprises a third stage having an upper surface adapted to support the substrate thereon.

24. The system of claim 23, further comprising an end effector disposed on an upper surface of the third stage, the end effector adapted to transfer one substrate between the load lock chamber and the substrate table.

25. The system of claim 24, wherein the end effector is extendable into the load lock chamber to transfer substrates between the load lock chamber and the testing chamber.

26. The system of claim 21, wherein the load lock chamber comprises a substrate support having at least two support trays.

27. The system of claim 26, wherein the at least two support trays each comprise a plurality of support pins disposed on an upper surface thereof.

28. The system of claim 21, wherein the load lock chamber and the testing chamber share a common environment which is maintained at a vacuum condition.

29. A method for testing one or more substrates within an integrated electron beam test assembly, comprising:
loading a substrate to be tested from a load lock chamber by means of a robot having an end effector, into a testing chamber having a substrate table disposed therein, the substrate table adapted to move the substrate within the testing chamber, the substrate table comprising:
a first stage movable in a first direction; and
a second stage movable in a second direction, wherein the first and
second directions are substantially orthogonal; and
testing the substrate using one or more electronic test devices disposed on an upper surface of the testing chamber, wherein each of the first and second stages move in an X direction or Y direction or both X and Y directions to position the substrate below the one or more electronic test devices; and wherein the end effector is adapted to extend in and retract from the load lock chamber.

30. The method of claim 29, wherein the one or more electronic test devices comprises electron beam testing devices.

31. The method of claim 29, wherein the one or more electronic test devices comprises four electron beam testing devices.

32. A method for testing one or more substrates within an integrated electron beam test assembly, comprising:
loading a substrate to be tested into a testing chamber having a substrate table disposed on a vertically movable pedestal assembly, the substrate table comprising:
a first stage movable in a first direction;
a second stage movable in a second direction;
a third stage having an upper surface adapted to support a substrate thereon; and
an end effector disposed on an upper surface of the third stage, wherein the first and second directions are substantially orthogonal;
elevating the substrate table by the pedestal assembly to position the substrate in a testing position prior to testing the substrate;
testing the substrate using one or more electronic test devices disposed on an upper surface of the testing chamber, wherein the first and second stages move in an X direction or Y direction or both X and Y directions to position the substrate below the one or more electronic test devices;
lowering the substrate table to an elevation of a load lock chamber disposed adjacent a first side of the testing chamber;
extending the end effector into the load lock chamber;
loading the substrate into the load lock chamber; and
retracting the end effector.

33. The method of claim 32, wherein the one or more electronic test devices comprises electron beam testing devices.

34. The method of claim 32, wherein the one or more electronic test devices comprises four electron beam testing devices.

* * * * *